(12) United States Patent
Palmer

(10) Patent No.: US 7,271,623 B2
(45) Date of Patent: Sep. 18, 2007

(54) LOW-POWER RECEIVER EQUALIZATION IN A CLOCKED SENSE AMPLIFIER

(75) Inventor: Robert E. Palmer, Carrboro, NC (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/017,477

(22) Filed: Dec. 17, 2004

(65) Prior Publication Data

US 2006/0132191 A1   Jun. 22, 2006

(51) Int. Cl.
*G01R 19/00* (2006.01)
*H03K 5/00* (2006.01)

(52) U.S. Cl. .................................. 327/52; 327/559

(58) Field of Classification Search ............ 327/50–52, 327/552–559
See application file for complete search history.

(56) References Cited

U.S. PATENT DOCUMENTS

| | | |
|---|---|---|
| 4,547,741 A | 10/1985 | Katakura |
| 4,750,155 A | 6/1988 | Hsieh |
| 5,646,905 A | 7/1997 | Pogrebnoy |
| 5,745,423 A | 4/1998 | Tai |
| 5,844,431 A | 12/1998 | Chen |
| 6,225,795 B1 | 5/2001 | Stratakos et al. |
| 6,239,667 B1 | 5/2001 | Roth |
| 6,265,911 B1 | 7/2001 | Nairn |
| 6,266,379 B1 | 7/2001 | Dally |
| 6,329,874 B1 | 12/2001 | Ye et al. |
| 6,353,343 B1 * | 3/2002 | Payne et al. .................. 327/52 |
| 6,429,692 B1 | 8/2002 | Chan et al. |
| 6,437,639 B1 * | 8/2002 | Nguyen et al. ............. 327/558 |
| 6,731,683 B1 | 5/2004 | Fiedler et al. |
| 6,812,872 B1 | 11/2004 | Lu |
| 6,819,166 B1 | 11/2004 | Choi et al. |
| 2004/0008059 A1 | 1/2004 | Chen et al. |

FOREIGN PATENT DOCUMENTS

DE            40 22 468 A1      1/1992

OTHER PUBLICATIONS

Choi, Jong-Sang, et al. "A CMOS 3.5Gbps Continuous-time Adaptive Cable Equalizer with Joint Adaptation Method of Low-Frequency Gain and High-Frequency Boosting." 2003, Symposium on VLSI Circuits Digest of Technical Papers pp. 103-106.

(Continued)

*Primary Examiner*—Dinh T. Le
(74) *Attorney, Agent, or Firm*—Silicon Edge Law Group LLP; Arthur J. Behiel

(57) ABSTRACT

A receiver includes clocked, differential equalization circuitry to compensate for signal attenuation that varies with the frequency of the input signal received over a respective communication channel. The incoming signal is split into filtered and unfiltered signal components. Separate current-steering transistors coupled in parallel amplify the filtered and unfiltered components and sum the results. The filter or filters used to separate the signal components may be tunable, e.g. using voltage-controlled filter components. The ratio of device sizes for the current-steering transistors sets the magnitude of the boost applied to high-frequency components. The embodiments include adjustable or programmable current-steering networks to facilitate adjustments that accommodate the unique characteristics of individual communication channels.

34 Claims, 6 Drawing Sheets

OTHER PUBLICATIONS

U.S. Appl. No. 60/572,951, filed May 21, 2004, Ramin Farjad-Rad.

Inukai, T. et al., "Boosted Gate MOS (BGMOS): Device/Circuit Cooperation Scheme to Achieve Leakage-Free Giga-Scale Integration." CICC 05/04 Technical Program. 4 pages.

Rao, Rahul M. et al."Circuit Techniques for Gate and Sub-Threshold Leakage Minimization in Future CMOS Technologies." European Solid-State Circuits Conference. Sep. 2003. 4 pages.

Sidiropoulos, Stefanos, et al., "A 700-Mb/s/pin CMOS Signaling Interface Using Current Integrating Receivers." IEEE Journal of Solid-State Circuits, vol. 32, No. 5, May 1997, pp. 681-690.

Shakiba, Mohammad Hossein, "A 2.5 Gb/s Adaptive Cable Equalizer." 1999 IEEE International Solid-State Circuits Conference, Session 23, Paper WP 23.3 pp. 396-397.

Baker, Alan J., "An Adaptive Cable Equalizer for Serial Digital Video Rates to 400 Mb/s". 1998 IEEE International Solid-State Circuit Conference, Session 10, Paper FA 10.7, pp. 174-175.

Granberg, Tom, "Handbook of Digital Techniques for High-Speed Design." (C) 2004 by Pearson Education, Inc. Publishing as Prentice Hall PTR. Cover sheet, pub. sheet, pp. 211-226.

Stojanovic, Vladimir, "Transmit Pre-Emphasis for High-Speed Time-Division-Multiplexed Serial-Link Transceiver", Dept. of Electrical Engineering, Stanford Univ. 6 pages, Submitted to IEEE Symposium on VLSI Circuits, Jun. 2003.

Zerbe, J., "Equalization and Clock Recovery for a 2.5-10Gb/s 2-PAM/4-PAM Backplane Transceiver Cell." ISSCC 2003, Session 4, paper 4.6. 10 pgs, Feb. 10, 2003.

Zerbe, J., "Equalization and Clock Recovery for a 2.5-10-Gb/s 2-PAM/4-PAM Backplane Transceiver Cell." IEEE Journal of Solid-State Circuits, vol. 38, No. 12, Dec. 2003, pp. 2121-2130.

Kudoh, Yoshiharu, "A 0.3-um CMOS 5-Gb/s 10-m 28 AWG Cable Transceiver with No-Feedback-Loop Continuous-Time Post-Equalizer." IEEE Journal of Solid-State Circuits, vol. 38, No. 5, May 2003. pp. 741-746.

Madduri, Vasanta. High Speed Backplanes in Communications Systems. Mar. 2004. 7 pages.

Zhang, Johnny et al. White Paper on Transmit Pre-Emphasis and Receive Equalization. Oct. 31, 2002. 8 pages.

Stojanovic, Vladimir, "Adaptive Equalization and Data Recovery in a Dual-Mode (PAM2/4) Serial Link Transceiver." Dept. of Electrical Engineering, Stanford. 4 pages, no date.

Madduri, Vasanta. High Speed Backplanes in Communications Systems. Presented at the Communications Design Conference, Mar. 2004. 25 pages.

Farjad-Rad, Ramin. 0.622-8.0Gbps 150mW Serial IO Macrocell with Fully Flexible Preemphasis and Equalization. Symposium on VLSI Circuits Digest of Technical Papers, no date.

* cited by examiner

LOW-POWER RECEIVER EQUALIZATION IN A CLOCKED SENSE AMPLIFIER

FIELD OF THE INVENTION

The present invention relates generally to the field of communications, and more particularly to high speed electronic signaling within and between integrated circuit devices.

BACKGROUND

Serial communication receivers are used in integrated circuits, such as application specific integrated circuits (ASICs), for clock synchronization and for recovery of serial data streams from transmission channels. Clock signals and data are recovered by detecting the data and transitions in the serial data stream. The voltage levels of data bits (or symbols) within such serial data stream may be depicted in an "eye diagram" in which a view of multiple waveforms of such data bits are superimposed upon each other. The time and voltage ranges of the data within each cycle in the stream are known as the data "eye." The serial data stream is preferably sampled at or near the center of this eye. Unfortunately, transmission channels normally used in serial links exhibit low-pass and other filter effects that distort transmitted signals which may result in closure of the data eyes and consequent transmission errors. Using a technique known as "receive equalization," or simply "equalization," serial receivers boost their voltage sensitivity at the attenuated frequencies to flatten the frequency response of the combined transmitter, communication channel, and receiver (collectively, the "link").

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
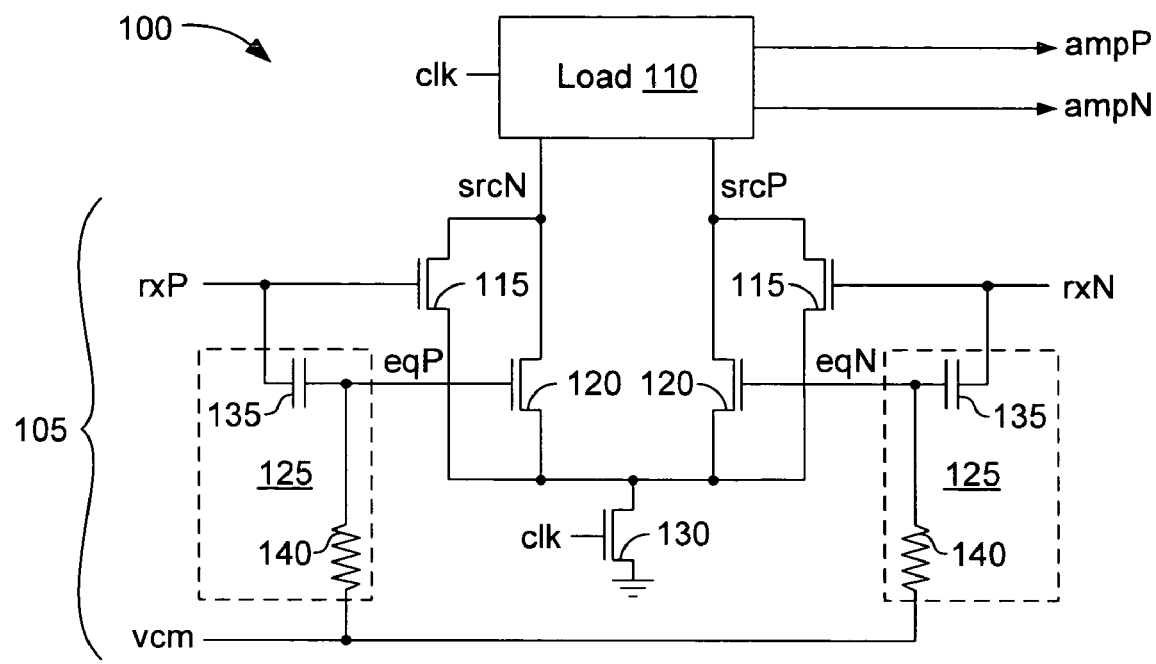
FIG. 1 depicts a portion of a receiver equipped with active equalization circuitry 100 in accordance with one embodiment.

FIG. 1 depicts a portion of a receiver equipped with active equalization circuitry 100 in accordance with one embodiment. Equalization circuitry 100 includes a pull-down network 105 and a regenerative load 110 that together form an equalizing, clocked, differential sense amplifier. Being differential, pull-down network 105 includes a pair of identical legs, each of which includes a first transistor 115, a second transistor 120, and a high-pass filter 125. In accordance with the depicted embodiment, each of a pair of differential signal halves rxP and rxN, on like-named input terminals, is split into two components, an unfiltered component to the control terminal (e.g., the gate) of a respective one of transistors 115 and a filtered component to the control terminal of a respective one of transistors 120.

Transistors 115 and 120 are current-steering devices. Referring to the left leg of network 105, the associated transistors 115 and 120 are coupled in parallel between a node srcN to load 110 and a clocking transistor 130. Transistors 115 and 120 of the right leg of network 105 are similarly coupled between a second node srcP and transistor 130. Due to the high-pass nature of filters 125, transistors 120 selectively amplify high-frequency signal components of the input signal. Filters 125 include, in the depicted embodiment, respective capacitors 135 and resistors 140, the values of which are selected to produce a negative-three decibel (−3 dB) point suitable for the input signal of interest. Filters 125 are coupled between respective input terminals rxP and rxN and a reference-voltage terminal vcm conveying the common-mode voltage of the differential input signal. As is conventional, the common-mode voltage on terminal vcm can be taken from the center tap of a high impedance extending between differential input nodes rxN and rxP: a filter capacitor coupled between the center tap and a supply terminal removes high-frequency signal components.

Both pull-down network 105 and regenerative load 110 are timed by a clock signal clk in this embodiment. Transistor 130 periodically couples the lower current-handling terminals (e.g., the sources) of transistors 115 and 120 to ground potential in response to clock signal clk. By sampling the input signal periodically, as opposed to continuously, equalization circuitry 100 advantageously consumes negligible static power.

Figure 2:
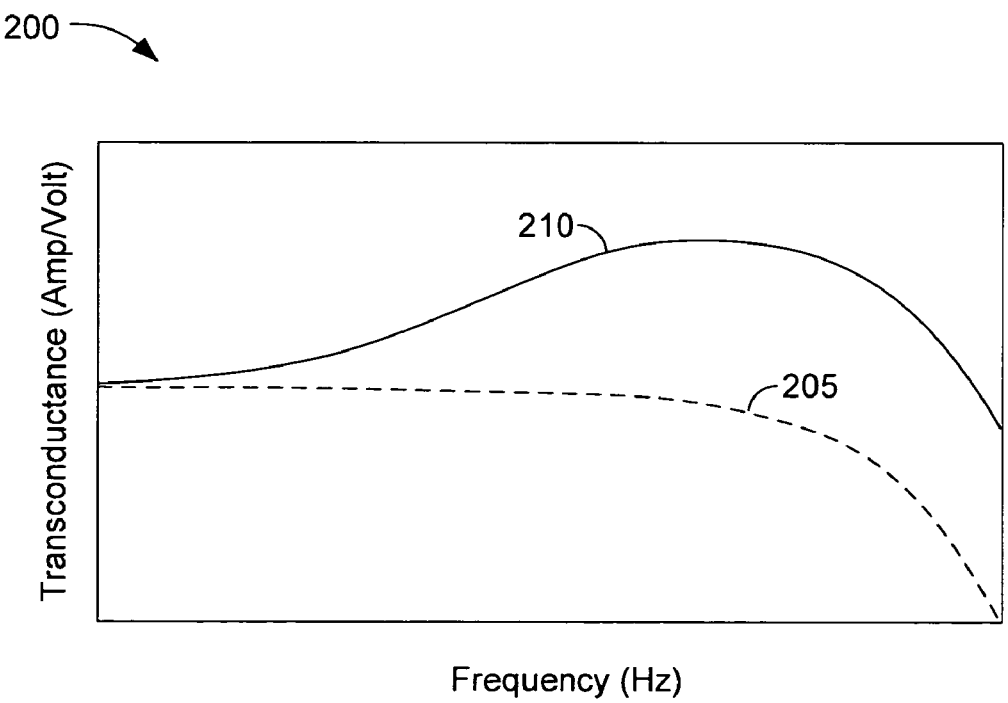
FIG. 2 is a diagram 200 relating transconductance with frequency for the equalization circuitry 100 of FIG. 1.

FIG. 2 is a diagram 200 relating transconductance with frequency for the equalization circuitry 100 of FIG. 1. A first trace 205 depicts the frequency response of pull-down network 105 in the absence of high-pass filters 125 and associated transistors 120 (i.e., with only transistors 115 to amplify input signal rxP/rxN). The transconductance of network 105 rolls off as frequency increases. Such roll off is undesirable, as the incoming data is similarly expected to roll off with increased frequency due to the low-pass nature of the associated communication channel. Network 105 compensates for the expected channel attenuation by separately amplifying high-frequency components of signal halves rxP and rxN to produce a transconductance curve similar to that shown as trace 210 of FIG. 2. To accomplish this compensation, filters 125 selectively block lower frequency signal components to produce a pair of equalization signals eqP and eqN. Transistors 120 then amplify these equalization signals by steering current through load 110. Transistors 115 and 120 are coupled in parallel so the amplified high-frequency components are added to the amplified full-spectrum input signals from transistors 115. Ideally, the resulting transconductance favors high-frequency signals in a manner that offsets the high-frequency attenuation associated with the communication channel of interest.

The −3 dB point of the high-pass filter is set by the values of blocking capacitors 135 and shunt resistors 140. Filters 125 may be tunable, if desired, e.g. by implementing resistors 140 as voltage-controlled resistances. The ratio of device sizes for transistors 115 relative to transistors 120 sets the magnitude of the "boost" applied to high-frequency components.

The filter effects of communication channels differ from one channel to the next. It is often desirable, therefore, to tailor receive equalization for the associated channel. Some embodiments address this desire using active equalization circuitry that is adjustable (e.g. programmable) to accommodate the unique characteristics of individual links.

Figure 3:
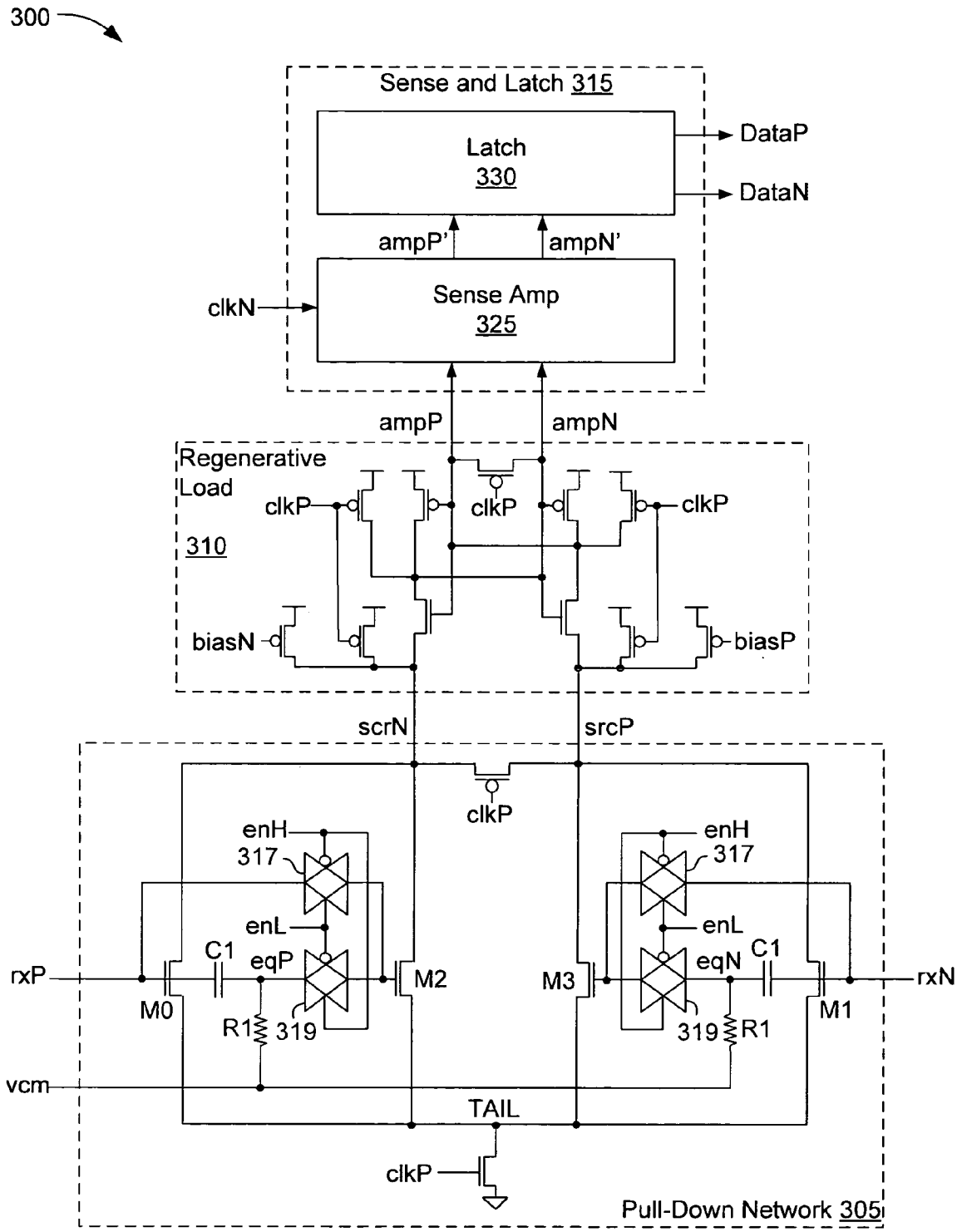
FIG. 3 depicts a programmable active equalizer 300 in accordance with another embodiment.

FIG. 3 depicts a programmable active equalizer 300 in accordance with another embodiment. Equalizer 300 is divided into three sections for ease of illustration: a pull-down network 305, a regenerative load 310, and a sense and latch stage 315. Pull-down network 305 operates in a manner similar to that described above in connection with FIGS. 1 and 2. A pair of differential input transistors M0 and M1 coupled to corresponding differential input nodes rxP and rxN differentially amplify the input signals to produce complimentary output signals sumN and sumP on liked-named circuit nodes. (In general, signals and the nodes that support them are referred to by the same designation.) An additional pair of current-steering transistors M2 and M3 coupled in parallel with respective transistors M0 and M1 have their respective control terminals selectively coupled to input terminals rxP and rxN.

With reference to the left leg of network 305, a pair of transmission gates 317 and 319, in response to complimentary enable signals enH and enL, selectively couple the control terminal of transistor M2 either directly to input terminal rxP or to input terminal rxP via a high-pass filter comprised of a capacitor C1 and a resistor R1. With transmission gate 317 enabled and transmission gate 319 disabled, both transistors M0 and M2 amplify the full-spectrum input signal half rxP; conversely, with transmission gate 317 disabled and transmission gate 319 enabled, transistor M0 amplifies the full spectrum of signal rxP while transistor M2 amplifies only the high-frequency equalization component eqP. The behavior of the right leg of network 305 operates similarly to amplify the second signal half rxN. Thus, by enabling different pairs of transmission gates 317 and 319, equalizer 300 can be tuned to provide different levels of equalization.

Regenerative load 310 serves as the load for transistors M0, M1, M2, and M3. Together, pull-down network 305 and load 310 form a clocked sense amplifier. A pair of bias voltages biasN and biasP can be adjusted as needed to remove any input offset in the amplifier stage (i.e., in network 305 and load 310). Bias voltages biasN and biasP are adjusted in the absence on an input signal until load 310 produces approximately the same percentage of ones and zeroes. In other words, the background noise on input terminals rxN and rxP should produce ones and zeros with equal probability.

The differential output signals from load 310, labeled ampP and ampN, are conveyed to a sense amplifier 325 within sense and latch circuitry 315. Sense amplifier 325 amplifies the differential output signals from load 310 and provides the results to a latch 330. The latched output signals are then presented as received data dataP and dataN. In the depicted embodiment, equalizer 300 is clocked using both phases of a differential clock clkP/clkN. Pull-down network 305 uses clock phase clkP to activate the current-steering devices by simultaneously pulling node TAIL to ground and decoupling output nodes srcN and srcP; load 310 uses the low-going half of the same clock phase clkP to precharge for the next sense event. Sense amplifier 325 captures the output from load 310 using the complementary clock phase clkN.

Figure 4:
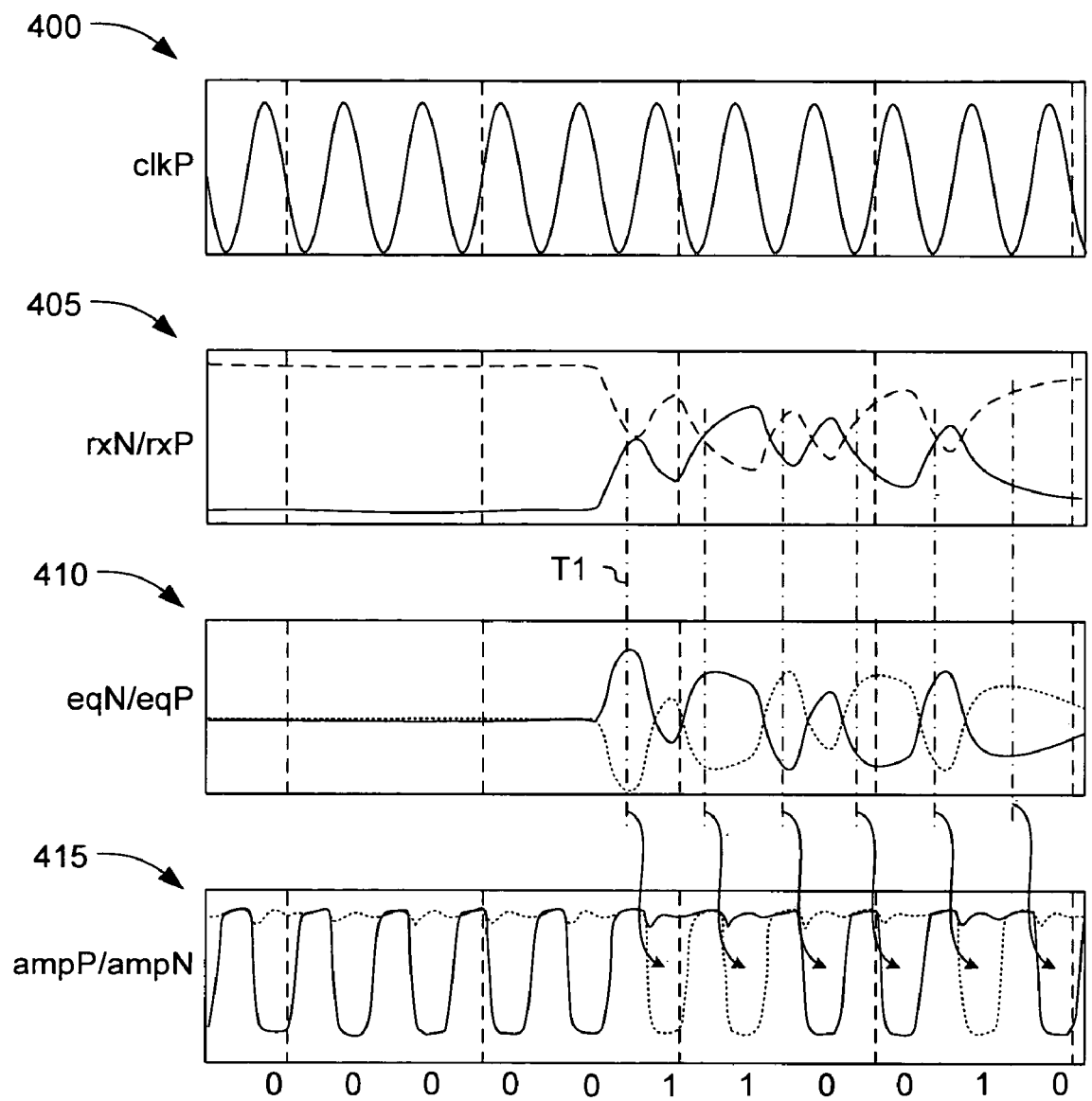
FIG. 4 depicts four waveform diagrams 400, 405, 410, and 415 that together illustrate the operation of pull-down network 305 and regenerative load 310 of FIG. 3.

FIG. 4 depicts four waveform diagrams 400, 405, 410, and 415 that together illustrate the operation of pull-down network 305 and regenerative load 310 of FIG. 3. The first waveform 400 depicts clock signal clkP, which provides the timing for pull-down network 305 and load 310. Diagram 405 depicts an exemplary complimentary input signal as complementary signal halves rxN and rxP. Of particular interest, at time T1 signals rxN and rxP do not cross, as they should to express a logic one, due to the low-pass nature of the hypothetical channel providing the data. As depicted in diagram 410, the appropriate signal crossing is reflected at time T1 for signals eqP and eqN due to the high-pass nature of the respective filters. The current-steering transistors sum the amplified versions of signals rxN/rxP and eqN/eqP, causing load 310 to correctly interpret the received signal as a logic one. The waveform of diagram 415 is an exemplary output of load 310 for an embodiment in which the received signal of diagram 405 is sampled at half the received bit rate.

Figure 5:
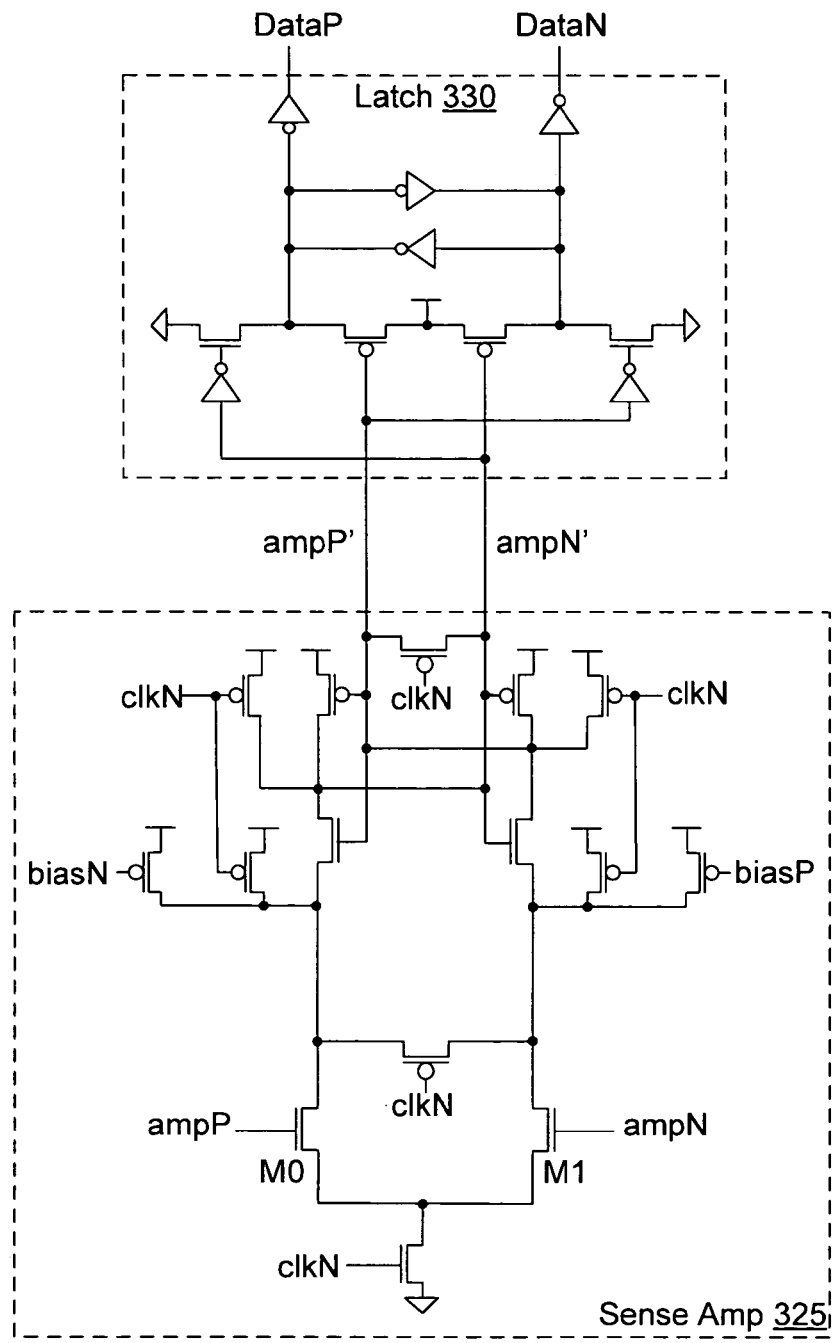
FIG. 5 details an embodiment of sense and latch circuitry 315 of FIG. 3.

FIG. 5 details an embodiment of sense and latch circuitry 315 of FIG. 3. Sense amplifier 325 and latch 330 are depicted schematically in a manner easily understood by those of skill in the art. A detailed discussion of sense amplifier 325 and latch 330 is therefore omitted for brevity. Some of the inverters are depicted as having inverting inputs to aid in reading the schematic. Any net associated with a logic-low signal has a bubble on it; inversely, any net without a bubble is associated with a logic-high signal.

Figure 6:
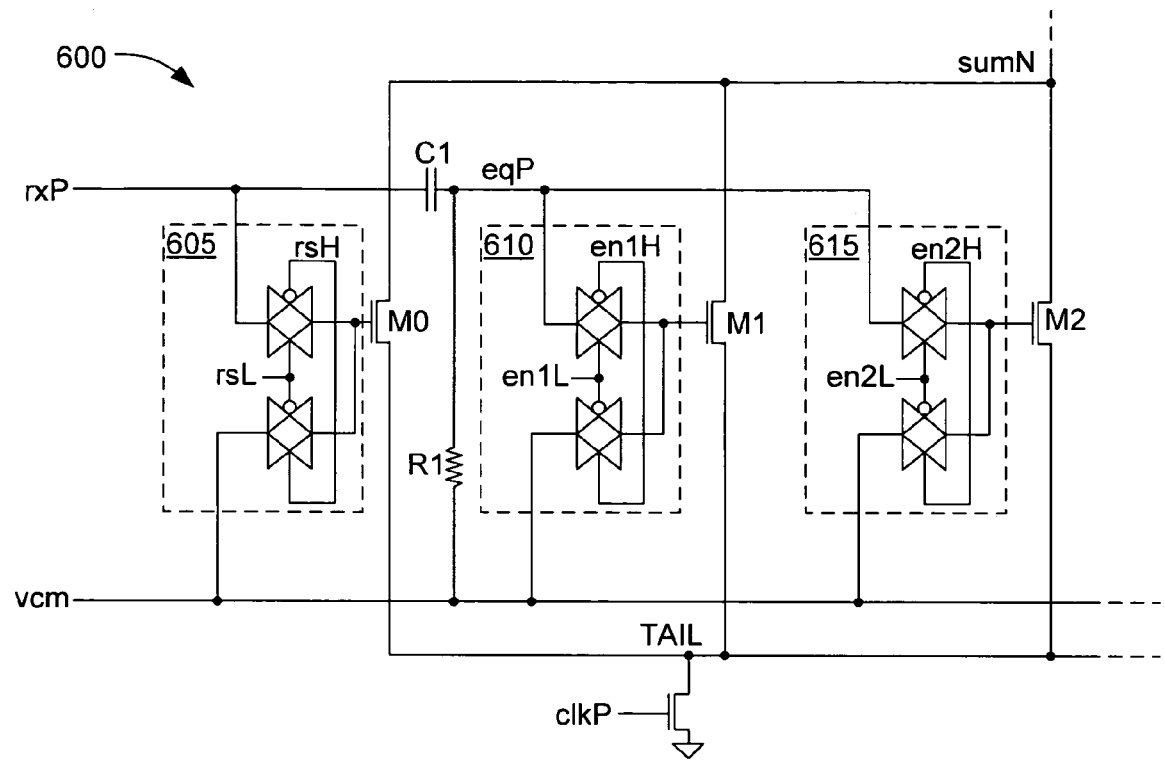
FIG. 6 depicts one of two complementary legs 600 of an equalizer adapted in accordance with another embodiment.

FIG. 6 depicts one of two complementary legs 600 of an equalizer adapted in accordance with another embodiment. It is to be understood that leg 600 may be used in conjunction with a similar leg in the manner discussed above in connection with equalizer 300 of FIG. 3. Leg 600 includes three transistors M0, M1, and M2 coupled in parallel between node sumN and tail node TAIL. The control terminal of each transistor is alternatively coupled to an input terminal rxP or a common-mode voltage terminal vcm via a respective one of three multiplexers 605, 610, and 615, each of which includes a pair of transmission gates similar to those described above in connection with equalizer 300. The leftmost multiplexer 605 is used with its counterpart in the second leg (not shown) to provide a stage in which offset trim can be performed on the sense amplifier. The sense amplifier contains a trimmable regenerative load (not shown), which can be identical to load 310 of FIG. 3, for example. To establish the appropriate bias levels, multiplexers 605, 610, and 615 couple the control terminals of transistors M0, M1, and M2 respectively to node vcm, which supplies the common-mode voltage of the differential input signal. Bias levels for the associated load are then established such that the load produces approximately the same percentage of ones and zeroes, irrespective of the nature of the input signal. For example, mere noise presented on the input terminals (e.g., rxP) with the terminals of all three transistors coupled to common-mode voltage node vcm should produce ones and zeros with equal probability.

In operation, the control terminal of transistor M0 remains coupled to input terminal rxP. Multiplexers 610 and 615 selectively couple the control terminals of transistors M1 and M2 to input node rxP via a high-pass filter comprised of a capacitor C1 and a resistor R1. Just as in the examples of FIGS. 1 and 3, when the control terminals of transistors M1 and M2 are coupled to the input terminal rxP via a high-pass filter, those transistors boost the amplification factor of relatively high-frequency signal components of signal half rxP. Complimentary control signals en1L/en1H and en2L/en2H can be selected to activate one or both of transistors M1 and M2 to provide different levels of high-frequency amplification. Signals en1L/en1H can be controlled by any number of conventional means, such as via an externally supplied control signal, a register, or some non-volatile memory. Signals en1L/en1H can also be controlled dynamically, using e.g. a microcontroller or a finite stage machine, to account for changes in transmitter, channel, or receiver characteristics that occur over time, due to changes in e.g. supply voltage, temperature, and the noise environment.

Figure 7:
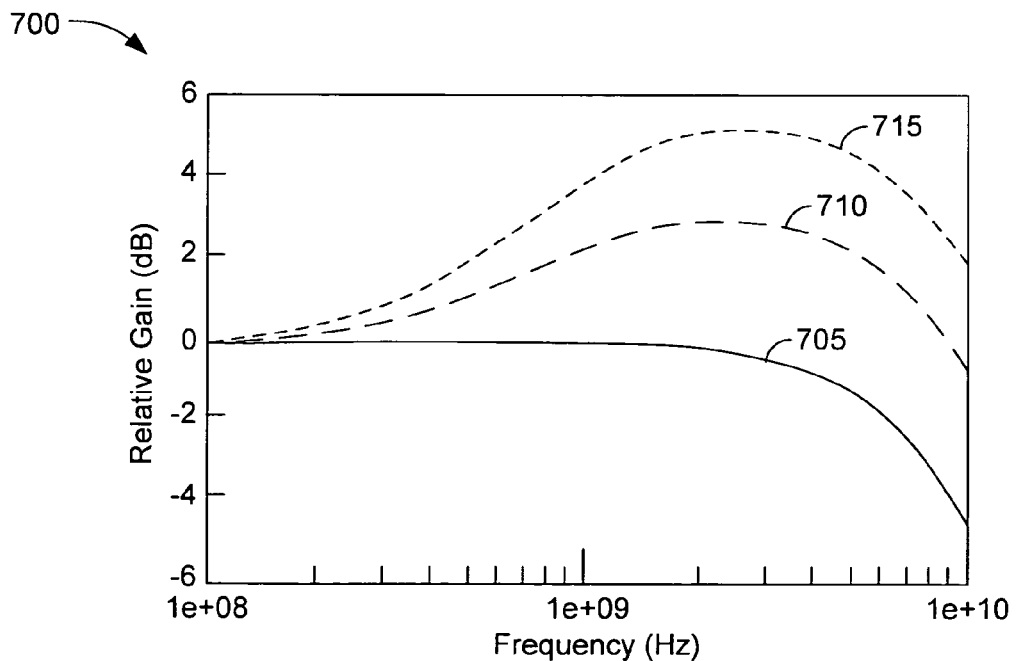
FIG. 7 depicts a diagram 700 showing hypothetical frequency responses for an embodiment of leg 600 of FIG. 6.

FIG. 7 depicts a diagram 700 showing hypothetical frequency responses for an embodiment of leg 600 of FIG. 6 optimized for e.g. 6 Gbps operation. The lowermost trace 705 depicts the response when multiplexers 610 and 615 couple the control terminals of both transistors M1 and M2 to node vcm, in which case transistors M1 and M2 do not amplify the incoming signal on node rxP. The middle trace 710 depicts the response of leg 600 when multiplexer 610 couples the control terminal of transistor M1 to capacitor C1 and multiplexer 610 couples the control terminal of transistor M2 to node vcm, in which case transistor M1 amplifies equalization signal eqP and adds the results to the response from transistor M0. The third and final trace 715 depicts the response of leg 600 when multiplexers 610 and 615 couple the control terminals of transistors M1 and M2 to capacitor C1, in which case both transistors M1 and M2 amplify equalization signal eqP and add the results to the response from transistor M0. In this example transistor M1 and M2 are assumed to have similar geometries, so that the activation of either transistor M1 or M2 accomplishes approximately the same degree of added amplification for high-frequency signal components. In other embodiments, differently sized transistors, additional transistors, or both can be added to provide extended programmability.

Figure 8:
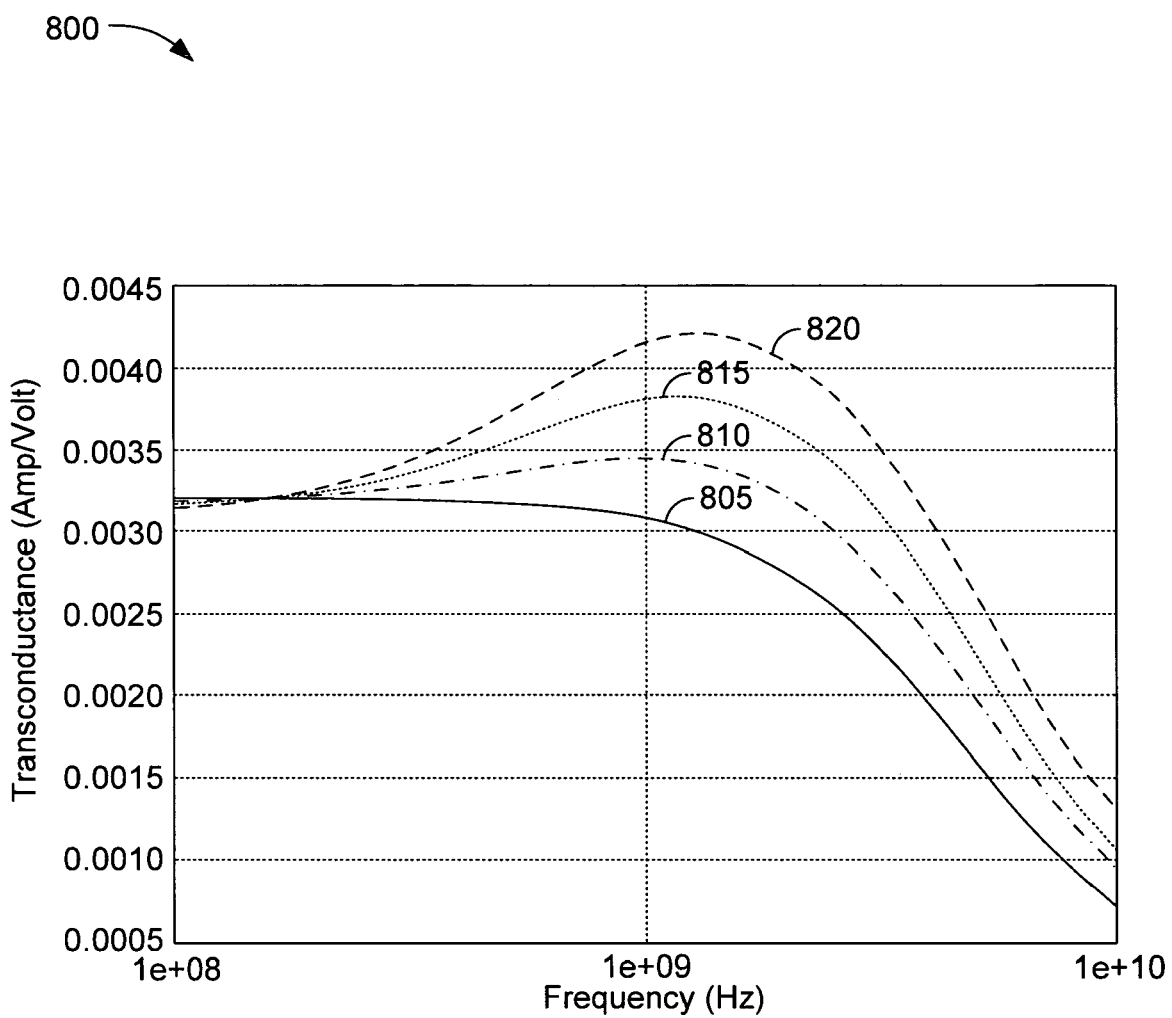
FIG. 8 depicts an exemplary diagram 800 depicting the frequency response of leg 600 in an example in which transistors M1 and M2 have binary-coded widths.

FIG. 8 depicts an exemplary diagram 800 depicting the frequency response of leg 600 in an example in which transistors M1 and M2 have binary-coded widths. Transistor M2 might be twice as wide as transistor M1, for example, and consequently provide approximately twice the amplification as transistor M1. In that case, leg 600 offers four possible frequency responses: first, both transistors M1 and M2 are inactive (trace 805), second, only transistor M1 is active (trace 810), third, only transistor M2 is active (trace 815), and finally both transistors M1 and M2 are active (trace 820). Additional thermometer-coded, binary-coded, or other configurations can be used to provide still greater flexibility. For example, additional transistors can be included in parallel with the other current-steering devices. Furthermore, additional filters can be placed between different control terminals and input terminal rxP, an option that can be used to provide enhanced frequency-response control. Many permutations are possible, as will be evident to those of skill in the art. In one example, diagram 800 characterizes an embodiment optimized to operate at about 3 Gbps.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. Embodiments of the invention may be adapted for use with multi-pulse-amplitude-modulated (multi-PAM) signals.

As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted.

An output of the design process for an integrated circuit, or a portion of an integrated circuit, may be a computer-readable medium (e.g., a magnetic tape or an optical or magnetic disk) encoded with data structures or other information defining circuitry that may be physically instantiated as an integrated circuit or portion of an integrated circuit. These data structures are commonly written in Caltech Intermediate Format (CIF) or GDSII, a proprietary binary format. Those of skill in the art of mask preparation can develop such data structures from schematic diagrams of the type detailed above.

While the present invention has been described in connection with specific embodiments, variations of these embodiments will be obvious to those of ordinary skill in the art. For example, the foregoing embodiments can be implemented with different types and configurations of transistors. Further, the circuitry can be flipped, as by exchanging PMOS transistors for NMOS transistors, and vice versa. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. Section 112.

What is claimed is:

1. A receiver comprising:
   a. a first input terminal, a second input terminal, a first output terminal, and a second output terminal;
   b. a first transistor having a first current-handling terminal coupled to the first output terminal, a second current-handling terminal, and a first control terminal coupled to the first input terminal;
   c. a second transistor having a third current-handling terminal coupled to the first output terminal, a fourth current-handling terminal, and a second control terminal;

d. a first high-pass filter coupled between the first and second control terminals;
e. a third transistor having a fifth current-handling terminal coupled to the second output terminal, a sixth current-handling terminal, and a third control terminal coupled to the second input terminal;
f. a fourth transistor having a seventh current-handling terminal coupled to the second output terminal, an eighth current-handling terminal, and a fourth control terminal;
g. a second high-pass filter coupled between the third and fourth control terminals; and
h. a regenerative load having a first load input terminal coupled to the first and third current-handling terminals and a second load input terminal coupled to the fifth and seventh current-handling terminals.

2. The receiver of claim 1, further comprising a fifth transistor having a ninth current-handling terminal coupled to the second and fourth current-handling terminals, a tenth current-handling terminal, and a fifth control terminal.

3. The receiver of claim 2, further comprising a clock terminal adapted to receive a periodic clock signal, wherein the clock terminal is coupled to the fifth control terminal.

4. The receiver of claim 1, further comprising:
a. a fifth transistor having a ninth current-handling terminal coupled to the first and third current-handling terminals, a tenth current-handling terminal coupled to the fifth and seventh current-handling terminals, and a fifth control terminal; and
b. a clock terminal adapted to receive a periodic clock signal, wherein the clock terminal is coupled to the fifth control terminal.

5. The receiver of claim 1, wherein the first high-pass filter includes a capacitor coupled between the first and second control terminals.

6. The receiver of claim 1, wherein the first high-pass filter includes a resistor coupled between the second control terminal and a reference-voltage node.

7. The receiver of claim 1, further comprising a switch coupled between the first and second control terminals.

8. The receiver of claim 1, wherein the first high-pass filter is selectively, coupled between the first control terminal and the second control terminal via a first multiplexer, and wherein the second high-pass filter is selectively coupled between the third control terminal and the fourth control terminal via a second multiplexer.

9. The receiver of claim 8, wherein at least one of the first and second multiplexers includes a multiplexer input terminal coupled to a reference-voltage node.

10. The receiver of claim 9, wherein the first control terminal is selectively coupled to one of the first input terminal or the reference-voltage node via third multiplexer.

11. A receiver comprising:
a. an input terminal and an output terminal:
b. a first transistor having a first current-handling terminal coupled to the output terminal, a second current-handling terminal, and a first control terminal coupled to the input terminal;
c. a second transistor having a third current-handling terminal coupled to the output terminal, a fourth current-handling terminal, and a second control terminal;
d. a high-pass filter selectively coupled between the first and second control terminals; and
e. a switch coupled in series with the high-pass filter;
f. wherein the switch comprises a multiplexer having a first multiplexer input terminal coupled to the first control terminal, a second multiplexer input terminal coupled to a reference-voltage node, and a multiplexer output terminal coupled to the second control terminal.

12. The receiver of claim 11, wherein the first multiplexer input terminal is coupled to the first control terminal via the high-pass filter.

13. The receiver of claim 12, wherein the high-pass filter includes at least one of a tunable capacitance and a tunable resistance.

14. The receiver of claim 12, wherein the filter includes a resistor and a capacitor coupled in series between the first control terminal and the reference voltage node.

15. The receiver of claim 11, further comprising a third transistor having a fifth current-handling terminal coupled to the first and third current-handling terminals, a sixth current-handling terminal coupled to the second and fourth current-handling terminals, and a third control terminal selectively coupled to the first control terminal.

16. The receiver of claim 15, wherein the third control terminal is, when coupled to the first control terminal, capacitively coupled to the first control terminal.

17. A receiver comprising:
a. an input terminal, to receive an input signal, and an output terminal;
b. a first transistor having a first current-handling terminal coupled to the output terminal, a second current-handling terminal, and a first control terminal coupled to the input terminal to receive the input signal;
c. a high-pass filter having a filter input node, coupled to the first control terminal, and a filter output node;
d. a multiplexer having a first multiplexer input terminal coupled to the filter output node, a second multiplexer input terminal, and a multiplexer output terminal;
e. a second transistor having a third current-handling terminal coupled to the first current-handling terminal, a fourth current-handling terminal, and a second control terminal coupled to the multiplexer output terminal; and
f. a reference-voltage node coupled to the second multiplexer input terminal.

18. A circuit for adjusting a received input signal having differential first and second signal halves, the circuit comprising:
a. a first current-steering leg having:
i. a first input node to receive the first signal half;
ii. a first output node;
iii. a first tail node;
iv. first and second current-steering devices each having a first terminal coupled to the first input node, a second terminal coupled to the first output node, and a third terminal coupled to the first tail node; and
v. a first filter;
vi. wherein the first terminal of at least one of the first and second current-steering devices is coupled to the first input node via the first filter;
b. a second current-steering leg having:
i. a second input node to receive the second signal half;
ii. a second output node;
iii. a second tail node;
iv. third and fourth current-steering devices each having fourth terminal coupled to the second input node, a fifth terminal coupled to the second output node, and a sixth terminal coupled to the second tail node; and
v. a second filter;
vi. wherein the fourth terminal of at least one of the third and fourth current-steering devices is coupled to the second input node via the second filter; and c. a regenerative load having a first load terminal coupled to the first output node and a second load terminal coupled to the second output node.

19. The circuit of claim 18, wherein the first and second tail nodes are a common tail node.

20. The circuit of claim 19, wherein the tail node is periodically coupled to a supply terminal.

21. The circuit of claim 18, wherein the first terminal of the second current-steering device and the fourth terminal of the fourth current-steering device are selectively coupled to the respective first and second filters via respective first and second multiplexers.

22. The circuit of claim 21, wherein the first terminal of the second current-steering device and the fourth terminal of the fourth current-steering device are selectively coupled to a reference-voltage node via the respective first and second multiplexers.

23. The circuit of claim 18, wherein the filters include a high-pass filter.

24. A circuit for adjusting a received input signal having differential first and second signal halves, the circuit comprising:
  a. a first current-steering leg having:
    i. a first input node to receive the first signal half:
    ii. a first output node:
    iii. a first tail node:
    iv. first and second current-steering devices each having a first terminal coupled to the first input node, a second terminal coupled to the first output node, and a third terminal coupled to the first tail node: and
    v. a first filter:
    vi. wherein the first terminal of at least one of the first and second current-steering devices is coupled to the first input node via the first filter:
  b. a second current-steering leg having:
    i. a second input node to receive the second signal half:
    ii. a second output node:
    iii. a second tail node:
    iv. third and fourth current-steering devices each having a fourth terminal coupled to the second input node, a fifth terminal coupled to the second output node, and a sixth terminal coupled to the second tail node: and
    v. a second filter:
    vi. wherein the fourth terminal of at least one of the third and fourth current-steering devices is coupled to the second input node via the second filter:
  c. a first switch coupled between the first filter and the first current-steering device and a second switch coupled between the second filter and the third current-steering device: and
  d. a regenerative load having a first load terminal coupled to the first output node and a second load terminal coupled to the second output node.

25. A system for equalizing an input signal on a respective input terminal, the system comprising:
  a. a first transistor having a first current-handling terminal, a second current-handling terminal, and a first control terminal coupled to the input terminal;
  b. a second transistor having a third current-handling terminal coupled to the first current-handling terminal, a fourth current-handling terminal, and a second control terminal;
  c. a filter coupled between the input terminal and the second control terminal, the filter exhibiting a negative three (−3) dB point;
  d. means for tuning the −3 dB point; and
  e. means for selectively coupling the input terminal to the second control terminal via the filter.

26. A differential receiver comprising:
  a. differential first and second input nodes to receive respective first and second differential signal components;
  b. differential first and second output nodes;
  c. a first leg including:
    i. a first transistor having a first current-handling terminal coupled to the first differential output node, a second current-handling terminal, and a first control terminal coupled to the first input node;
    ii. N second transistors, each having a third current-handling terminal coupled to the first differential output node, a fourth current-handling terminal, and a second control terminal; and
    iii. a first filter coupled between the first input node and at least one of the second control terminals of the N second transistors;
  d. a second leg including:
    i. a third transistor having a first current-handling terminal coupled to the second differential output node, a second current-handling terminal, and a first control terminal coupled to the second input node;
    ii. N fourth transistors, each having a third current-handling terminal coupled to the second differential output node, a fourth current-handling terminal, and a second control terminal; and
    iii. a second filter coupled between the second input node and at least one of the second control terminals of the N fourth transistors;
  e. a reference-voltage node; and
  f. a multiplexer selectively coupling the first control terminal of the first transistor to one of the reference-voltage node and the first input node.

27. The differential receiver of claim 26, wherein the reference-voltage node conveys a common-mode reference voltage vcm.

28. The differential receiver of claim 27, further comprising a second multiplexer to selectively couple the second control terminal of at least one of the N second transistors to one of the first filter and the reference-voltage node.

29. The differential receiver of claim 26, further comprising a tail transistor coupled between a second reference-voltage node and each of the second and fourth current-handling terminals, the tail transistor including a tail control terminal.

30. The differential receiver of claim 29, further comprising a clock terminal adapted to receive a periodic clock signal, wherein the clock terminal is coupled to the tail control terminal.

31. A circuit comprising:
  a. first and second input nodes to receive respective first and second signal halves;
  b. first and second filters coupled to the respective first and second input nodes, the first filter to split the first input signal into a first signal portion and a filtered second signal portion, the second filter to split the second input signal into a third signal portion and a filtered fourth signal portion;
  c. first and second transistors to amplify the respective first and third signal portions and to provide the resulting amplified first and third signal portions on respective first and second output nodes;
  d. third and fourth transistors to amplify the respective filtered second and fourth signal portions and to provide the resulting amplified second and fourth signal portions on the respective first and second output nodes to combine with the respective amplified first and third signal portions; and e. N additional pairs of transistors, each of the additional transistors being coupled to one of the first and second output nodes.

32. The circuit of claim 31, wherein the filters are tunable.

33. The circuit of claim 31, wherein the first and third signal portions are unfiltered.

34. The circuit of claim 31, wherein at least one transistor of the N additional pairs of transistors selectively amplifies the filtered second signal portion and at least one transistor of the N additional pairs of transistors selectively amplifies the filtered fourth signal portion.

* * * * *